(12) United States Patent
Liu et al.

(10) Patent No.: US 9,859,235 B2
(45) Date of Patent: Jan. 2, 2018

(54) UNDERBUMP METALLIZATION STRUCTURE

(75) Inventors: Yu-Wen Liu, Taipei (TW); Hao-Yi Tsai, Hsin-Chu (TW); Hsien-Wei Chen, Sinying (TW); Shin-Puu Jeng, Hsin-Chu (TW); Ying-Ju Chen, Tuku Township (TW); Shang-Yun Hou, Jubei (TW); Pei-Haw Tsao, Tai-Chung (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 706 days.

(21) Appl. No.: 12/619,503

(22) Filed: Nov. 16, 2009

(65) Prior Publication Data

US 2010/0187687 A1    Jul. 29, 2010

Related U.S. Application Data

(60) Provisional application No. 61/147,397, filed on Jan. 26, 2009.

(51) Int. Cl.
*H01L 23/488* (2006.01)
*H01L 23/00* (2006.01)
*H01L 23/31* (2006.01)

(52) U.S. Cl.
CPC .......... *H01L 24/05* (2013.01); *H01L 23/3157* (2013.01); *H01L 24/03* (2013.01); *H01L 24/11* (2013.01); *H01L 24/13* (2013.01); *H01L 2224/0215* (2013.01); *H01L 2224/02125* (2013.01); *H01L 2224/0345* (2013.01); *H01L 2224/03462* (2013.01); *H01L 2224/0401* (2013.01); *H01L 2224/0508* (2013.01); *H01L 2224/05018* (2013.01); *H01L 2224/05027* (2013.01); *H01L 2224/05096* (2013.01); *H01L 2224/05147* (2013.01); *H01L 2224/05155* (2013.01); *H01L 2224/05166* (2013.01); *H01L 2224/05171* (2013.01); *H01L 2224/05541* (2013.01); *H01L 2224/05552* (2013.01); *H01L 2224/05553* (2013.01); *H01L 2224/05557* (2013.01); *H01L 2224/05558* (2013.01); *H01L 2224/05566* (2013.01); *H01L 2224/05569* (2013.01); *H01L 2224/05572* (2013.01);*H01L 2224/05573* (2013.01); *H01L 2224/05644* (2013.01); *H01L 2224/05647* (2013.01); *H01L 2224/05655* (2013.01); *H01L 2224/1132* (2013.01); *H01L 2224/1145*
(Continued)

(58) Field of Classification Search
CPC . H01L 2224/02125; H01L 2224/05018; H01L 2224/05096; H01L 2224/05558; H01L 2224/0401; H01L 2224/05552; H01L 2224/05569; H01L 2224/16014
USPC .................. 257/738, 774, E23.021, E23.023
See application file for complete search history.

(56) References Cited

U.S. PATENT DOCUMENTS 5,248,903 A * 9/1993 Heim ............................ 257/748
6,300,250 B1 10/2001 Tsai
(Continued)

*Primary Examiner* — Marcos D Pizarro
(74) *Attorney, Agent, or Firm* — Slater Matsil, LLP

(57) ABSTRACT

A system and method for forming an underbump metallization (UBM) is presented. A preferred embodiment includes a raised UBM which extends through a passivation layer so as to make contact with a contact pad while retaining enough of the passivation layer between the contact pad and the UBM to adequately handle the peeling and shear stress that results from CTE mismatch and subsequent thermal processing. The UBM contact is preferably formed in either an octagonal ring shape or an array of contacts.

20 Claims, 4 Drawing Sheets

(52) U.S. Cl.
CPC ....... (2013.01); *H01L 2224/11334* (2013.01); *H01L 2224/11462* (2013.01); *H01L 2224/11849* (2013.01); *H01L 2224/13005* (2013.01); *H01L 2224/13007* (2013.01); *H01L 2224/13111* (2013.01); *H01L 2224/13139* (2013.01); *H01L 2224/13147* (2013.01); *H01L 2924/00013* (2013.01); *H01L 2924/01006* (2013.01); *H01L 2924/01013* (2013.01); *H01L 2924/01019* (2013.01); *H01L 2924/01022* (2013.01); *H01L 2924/01029* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01)

(56) References Cited

U.S. PATENT DOCUMENTS

| | | | |
|---|---|---|---|
| 6,426,281 | B1 | 7/2002 | Lin et al. |
| 6,541,366 | B1 | 4/2003 | Chin et al. |
| 6,605,524 | B1 | 8/2003 | Fan et al. |
| 6,756,184 | B2 | 6/2004 | Peng et al. |
| 6,770,958 | B2 | 8/2004 | Wang et al. |
| 6,825,541 | B2 | 11/2004 | Huang et al. |
| 7,034,402 | B1 * | 4/2006 | Seshan ............ 257/781 |
| 7,364,998 | B2 * | 4/2008 | Chiu et al. ........ 438/597 |
| 7,420,280 | B1 * | 9/2008 | Kelkar ............. 257/773 |
| 7,859,122 | B2 * | 12/2010 | Daubenspeck et al. ...... 257/781 |
| 2005/0093176 | A1 * | 5/2005 | Hung ............. H01L 24/05 257/786 |

* cited by examiner

UNDERBUMP METALLIZATION STRUCTURE

This application claims the benefit of U.S. Provisional Patent Application Ser. No. 61/147,397, filed on Jan. 26, 2009, and entitled "Underbump Metallization Structure," which application is incorporated herein by reference.

TECHNICAL FIELD

The present invention relates generally to a system and method of manufacturing semiconductor devices, and more particularly to a system and method for bump pad structures.

BACKGROUND

Generally, a bump may be formed on a semiconductor die in order to connect the semiconductor die to other dies or devices. These bumps are normally connected to the semiconductor die by layers of conductive material collectively known as under bump metallization (UBM) that extend through a first passivation layer. The UBM provides for a connection between the bump and a contact pad in order to electrically connect the bump to the various metal layers formed within the semiconductor die. The various metal layers are preferably separated by dielectric layers and at least a second passivation layer, which may include low-k or even extremely low-k dielectric materials.

This arrangement, however, causes materials with different coefficients of thermal expansions (CTE) to be deposited on each other. As such, when the temperature of these materials is raised, for example during a flip chip bond reflow process, the different materials will expand to different lengths, causing peeling stress and shear stress to build up along the interfaces. These stresses could easily lead to delamination, such as delamination between the UBM and the contact pad, which would immediately cause problems in yield and overall productivity. This problem is especially true when low-k and extremely low-k dielectrics are utilized for one or more of the dielectric layers.

As such, what is needed is a low cost method of solving this stress-induced delamination problem caused by CTE mismatches of the materials used.

SUMMARY OF THE INVENTION

These and other problems are generally solved or circumvented, and technical advantages are generally achieved, by preferred embodiments of the present invention which provide for a system and method of forming an underbump metallization (UBM).

In accordance with a preferred embodiment of the present invention, a semiconductor device comprises a substrate and a contact pad over the substrate. A passivation layer is located over the contact pad, and a UBM extends through the passivation layer. The UBM comprises a first portion in contact with the contact pad and a second portion in contact with the contact pad, and the first portion is separated from the second portion by a portion of the passivation layer.

In accordance with another preferred embodiment of the present invention, a semiconductor device comprises a substrate, a contact pad over the substrate, and a passivation layer over the contact pad. A cross section of the passivation layer comprises at least two openings through the passivation layer. A UBM is located over the passivation layer and within the at least two openings.

In accordance with yet another preferred embodiment of the present invention, a method of forming a UBM comprises providing a substrate with a contact pad and forming a passivation layer over the contact pad. First portions of the passivation layer are removed to form at least one opening to the contact pad while maintaining a second portion of the passivation layer between areas of the at least one opening. A UBM is formed over the passivation layer and in the at least one opening.

An advantage of a preferred embodiment of the present invention is that stresses caused by differences in materials' coefficient of thermal expansion are absorbed by the passivation layer and are not transmitted further into the structure, thereby helping to prevent or reduce delamination and device failure.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an under bump metallization (UBM) in connection with a contact pad. The invention may also be applied, however, to other types of electrical connections.

Figure 1:
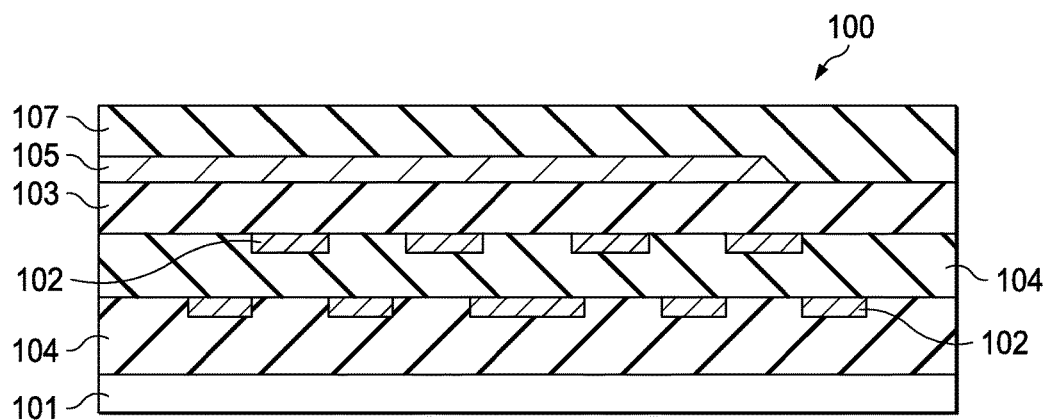
FIG. 1 illustrates a substrate with a contact pad and a passivation layer in accordance with an embodiment of the present invention.

With reference now to FIG. 1, there is shown a portion of a semiconductor device 100 including a substrate 101 with a first passivation layer 103, a contact pad 105, and a second passivation layer 107 over the substrate 101. The substrate 101 preferably comprises a semiconductor base material upon which active devices (not shown) are formed along with a series of alternating metal layers (such as copper layers formed through a damascene technique and collectively referred to as 102) and dielectric layers (such as low-k and extremely low-k dielectric layers and collectively referred to as 104) meant to interconnect and route circuitry from the active devices.

The first passivation layer 103 is preferably formed on the substrate 101 over the active devices. The first passivation layer 103 is preferably made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 103 is preferably formed through a process such as chemical vapor deposition (CVD), although any suitable process may be utilized, and preferably has a thickness between about 0.5 µm and about 5 µm, with a preferred thickness of about 9.25 KÅ.

The contact pad 105 is preferably formed over the first passivation layer 103. The contact pad 105 preferably comprises aluminum, but other materials, such as copper, may alternatively be used. The contact pad 105 is preferably formed using a deposition process, such as sputtering, to form a layer of material (not shown) and portions of the layer of material are then removed through a suitable process (such as photolithographic masking and etching) to form the contact pad 105. However, any other suitable process may be utilized to form the contact pad 105.

The contact pad 105 is preferably formed to have a thickness of between about 0.5 µm and about 4 µm, with a preferred thickness of about 1.45 µm. Further, the contact pad 105 is preferably formed in an octagonal shape which has a diameter of between about 34 µm and about 154 µm, with a preferred diameter of about 89 µm.

The second passivation layer 107 is preferably formed over the contact pad 105. The second passivation layer 107 is preferably formed of a similar material as the first passivation layer 103 (e.g., silicon oxides, silicon nitrides, low-k dielectrics, extremely low-k dielectrics, combinations of these, and the like). Further, the second passivation layer 107 may be formed through a similar process as the first passivation layer 103, such as CVD, although other processes may alternatively be used, and preferably has a thickness of between about 0.5 µm and about 5 µm, with a preferred thickness of about 1 µm.

Figure 2:
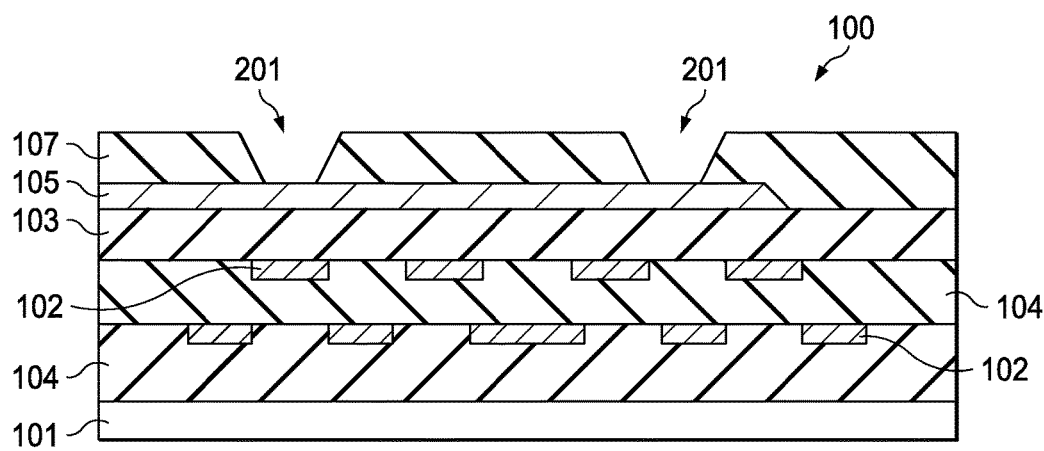
FIG. 2 illustrates the formation of openings through the passivation layer in accordance with an embodiment of the present invention.

FIG. 2 illustrates that, once the second passivation layer 107 has been formed, at least two openings 201 are made through the second passivation layer 107 by removing portions of the second passivation layer 107 to expose at least a portion of the underlying contact pad 105. These openings 201 allow for contact between the contact pad 105 and a subsequently formed UBM (e.g., see UBM 301 described below with respect to FIG. 4). The openings 201 are preferably formed using a suitable photolithographic mask and etching process, although any suitable process to expose portions of the contact pad 105 may be used. Preferably, the openings have an aspect ratio (e.g., the depth of the openings 201 divided by the width of the openings) of between about 0.025 and about 1, with a preferred aspect ratio of about 0.1, and preferably exposes between about 14% and about 88% of the area of the underlying contact pad 105.

Figure 3:
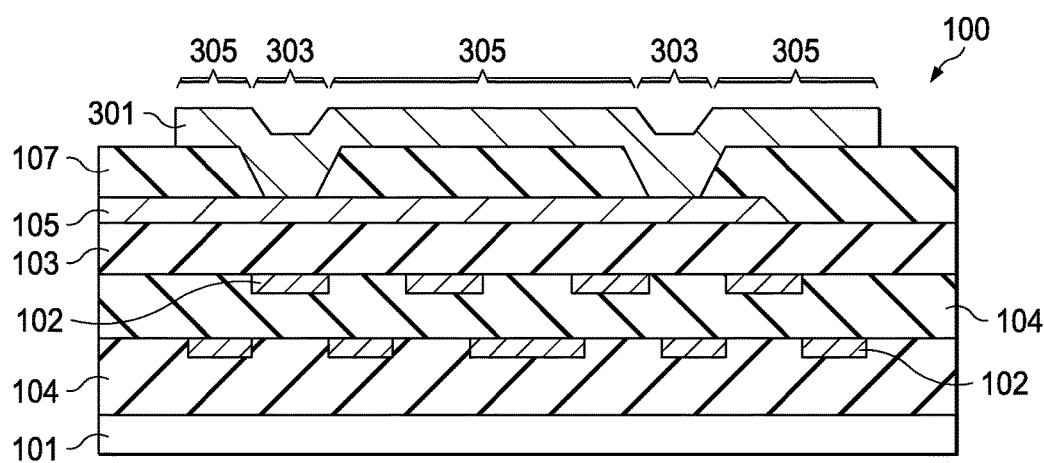
FIG. 3 illustrates the formation of a UBM over the passivation layer and in the openings in accordance with an embodiment of the present invention.

FIG. 3 illustrates the formation of a UBM 301 that extends into the openings 201 and through the second passivation layer 107 such that first portions 303 of the UBM 301 are preferably in electrical contact with the contact pad 105 while second portions 305 of the UBM 301 are separated from the contact pad 105 by at least the second passivation layer 107, effectively raising the UBM 301 above the contact pad 105. Further, while the precise dimensions of the UBM 301 will be dependent at least in part upon the design of the semiconductor device 100, in a preferred embodiment the UBM 301 preferably has a diameter of between about 30 µm and about 150 µm, with a preferred diameter of about 85 µm.

The UBM 301 preferably comprises at least three layers of conductive materials, such as a layer of titanium, a layer of copper, and a layer of nickel. However, one of skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 301. Any suitable materials or layers of material that may be used for the UBM 301 are fully intended to be included within the scope of the current application.

The UBM 301 is preferably created by forming each layer conformally over the second passivation layer 107 and along the interior of the openings 201. The forming of each layer is preferably performed using a plating process, such as electrochemical plating, although other processes of formation, such as sputtering, evaporation, or PECVD process, may alternatively be used depending upon the desired materials. The UBM 301 is preferably formed to have a thickness of between about 0.7 and about 10 times the height of the second passivation layer 107, with a preferred thickness of about 5 times the height of the preferred thickness of the second passivation layer 107. This preferably results in the UBM 301 having a thickness of between about 0.7 µm and about 10 µm, with a preferred thickness of about 5 µm. Once the desired layers have been formed, portions of the layers are then preferably removed through a suitable photolithographic masking and etching process to remove the undesired material and to leave the UBM 301 in a preferred shape, such as an octagonal, square, or rectangular shape, although any desired shape may alternatively be formed.

Figure 4A:
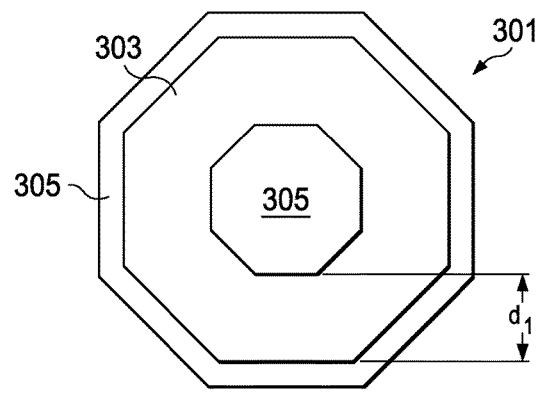
FIGS. 4A-4C illustrate various plan views of the UBM in accordance with an embodiment of the present invention.
Figure 4B:
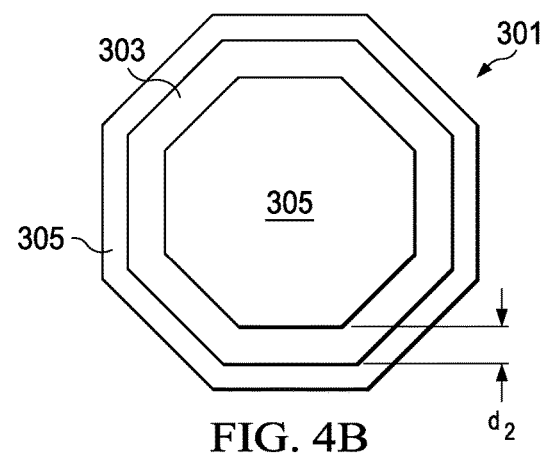
Figure 4C:
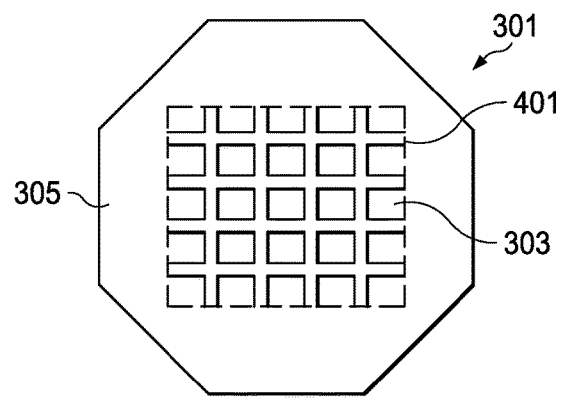

FIGS. 4A-4C illustrate various plan views of the UBM 301, including the first portions 303 of the UBM 301 that are preferably in contact with the underlying contact pad 105 and second portions 305 of the UBM 301 that are separated from the underlying contact pad 105 by at least the second passivation layer 107. These figures also illustrate that at least a portion of the UBM 301 within a region enclosed by the outer edges of where the UBM 301 contacts the contact pad 105 through the second passivation layer 107. By forming the UBM 301 such that the second passivation layer 107 is interposed between the UBM 301 and the contact pad 105 in areas enclosed by the outermost contact between the UBM 301 and the contact pad 105, the second passivation layer 107 can absorb some of the stresses caused by CTE mismatch during further processing and usage, and preventing the stress from being transferred into the underlying dielectric layers, thereby leading to a reduction in failures and an increase in yield.

FIG. 4A illustrates one preferred embodiment in which the openings (unseen in FIG. 5A as they are covered by the UBM 301) and, subsequently the first portions 303 of the UBM 301 that are preferably in contact with the contact pad 105, are shaped in an octagonal pattern. The octagonal pattern of this preferred embodiment preferably has an inner diameter and an outer diameter separated by a first distance $d_1$ of between about 15 µm and about 25 µm, with a preferred first distance $d_1$ of about 20 µm. With a preferred 20 µm octagonal shape for the first portions 303, between about 41% and about 62% of the UBM 301 makes contact with the contact pad 105, with about 52.1% being most preferred.

FIG. 4B illustrates a more preferred embodiment similar to the embodiment of FIG. 4A, but which has a shorter second distance $d_2$ between the inner and outer octagonal rings, resulting in a larger area of the second passivation layer 107 between the UBM 301 and the contact pad 105. In this embodiment the second distance $d_2$ between the inner and outer octagonal rings is between about 5 µm and about 15 µm, with a preferred second distance $d_2$ of about 10 µm. The shorter distance between the inner octagonal ring and the outer octagonal ring increases the ability of the second passivation layer 105 to reduce the stresses caused by CTE mismatch during high temperature processing and usage, thereby leading to less delamination and higher yield. With a preferred 10 µm octagonal shape for the first portions 303, between about 14% and about 41% of the UBM 301 makes contact with the contact pad 105, with about 28.4% being most preferred.

FIG. 4C illustrates yet another embodiment of the present invention in which an array of first portions 303 of the UBM 301 is formed through the second passivation layer 107 in connection with the contact pad 105. In this embodiment it is more apparent that, similar to the previous embodiments, the outermost first portions 303 form a boundary 401 (represented by the dashed line) which encloses at least a portion of the second passivation layer 107 (not visible in the plan view of FIG. 4C but located between the first portions 303 of the UBM 301). This array is preferably formed in a 5×5 pattern of square shapes, although any number of first portions 303 and alternate shapes for each of the first portions 303 of the UBM 301 may alternatively be utilized. The individual first portions 303 are preferably between about 1 µm and about 10 µm on each side, with the shapes most preferably being 5 µm on each side to form the square shape.

However, as one of ordinary skill in the art will recognize, the preferred embodiments as detailed above are but illustrative representations of preferred embodiments of the present invention. Other embodiments not described above, such as embodiments with dimensions outside of the specific ranges detailed may also be utilized with the present invention. All of these embodiments are fully intended to be included within the scope of the present invention.

By utilizing these preferred embodiments of the present invention, both peeling stress and shear stress can be reduced from the standard, baseline shape of the UBM's 301 contact with the contact pad 105 as described above in the Background section. Tests have shown that, given the historical shape of a UBM as a baseline with 100% shear stress and 100% peeling stress, the preferred embodiment of the UBM 301 with a 20 µm octagonal ring reduces the peeling stress to 88% of the baseline, and reduces the shear stress to 76% of the baseline. The 5×5 array reduces the peeling stress to 85% of the baseline peeling stress and reduces the shear stress to 71% of the shear stress. Finally, the preferred 10 µm octagonal ring reduces the peeling stress to 80% of the baseline peeling stress and reduces the shear stress to only 67% of the baseline shear stress. By reducing these stresses, further damage related to CTE mismatch between the materials can be reduced, leading to increased overall yield.

Additionally, while FIGS. 4A-4C illustrate multiple preferred embodiments of the present invention, the present invention is not intended to be limited to just the shapes herein presented. Any suitable shape of the openings 201 and the UBM 301, such as slots or squares, in which a portion of the second passivation layer 107 is located within the boundary defined by the outer contacts of the UBM 301 and the contact pad 105 and absorbs some of the stresses caused by CTE mismatch between the materials may also be used. All of these shapes are fully intended to be included within the scope of the present invention.

Figure 5A:
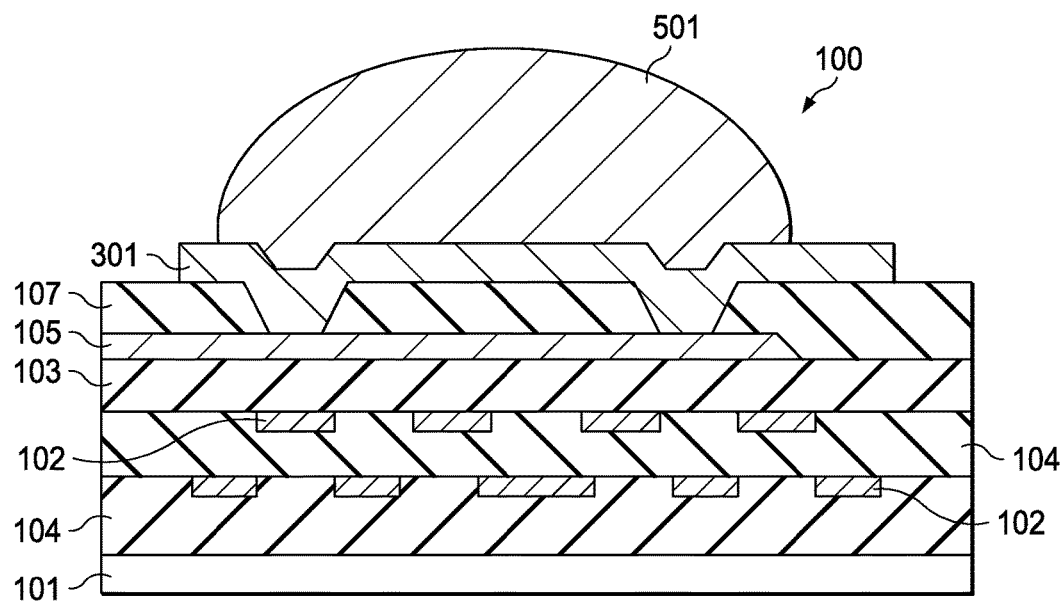
FIG. 5A illustrates the formation of a contact bump over the UBM in accordance with an embodiment of the present invention.

FIG. 5A illustrates the formation of a contact bump 501 over the UBM 301. The contact bump 501 preferably comprises a material such as tin, or other suitable materials, such as silver, lead-free tin, or copper. In an embodiment in which the contact bump 501 is a tin solder bump, the contact bump 501 may be formed by initially forming a layer of tin through such commonly used methods such as evaporation, electroplating, printing, solder transfer, ball placement, etc., to a preferred thickness of about 100 µm. Once a layer of tin has been formed on the structure, a reflow is preferably performed in order to shape the material into the desired bump shape.

Figure 5B:
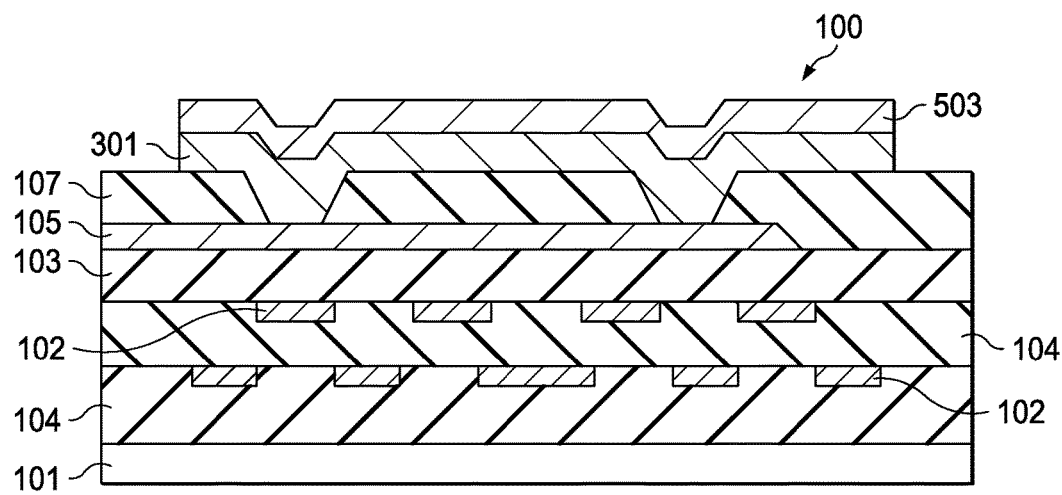
FIG. 5B illustrates the formation of a contact landing pad over the UBM in accordance with an embodiment of the present invention.

FIG. 5B illustrates an alternative embodiment wherein a contact landing pad 503, instead of a contact bump 501, is formed over the UBM 301. In this embodiment the contact landing pad 503 preferably comprises copper, although any suitable conductive material, such as aluminum or tungsten, may alternatively be used. In an embodiment in which the contact landing pad 503 is copper, the contact landing pad 503 is preferably formed through a suitable plating process, although other processes for other materials, such as CVD, may alternatively be used. The contact landing pad 503 is preferably formed to have a similar shape as the UBM 301 (e.g., octagonal), although any suitable shape, such as a square or rectangular shape, may alternatively be used as desired.

Figure 6:
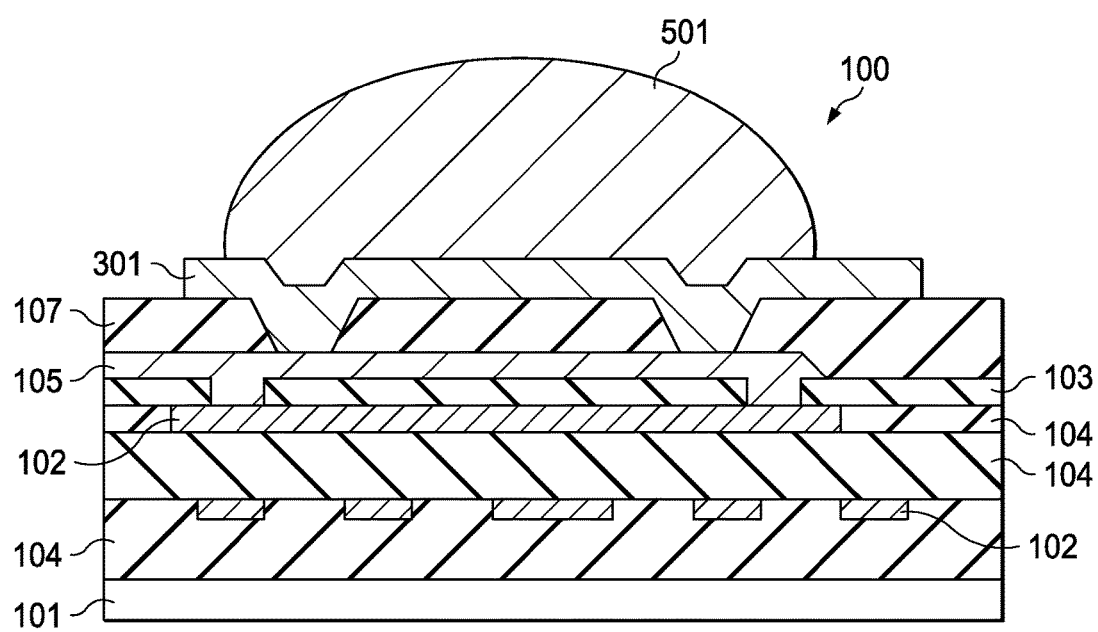
FIG. 6 illustrates a raised contact pad in addition to the UBM in accordance with an embodiment of the present invention.

FIG. 6 illustrates another preferred embodiment in which not only is the UBM 301 raised as described above with respect to FIGS. 4-5B, but the contact pad 105 is additionally raised. In this embodiment the contact pad 105 is formed so as to extend through the first passivation layer 103 and make contact with the uppermost of the underlying metal layers 102. In a similar fashion as the UBM 301 makes contact with the contact pad 105 (described above with respect to FIGS. 4-5B), the raised contact pad 105 preferably has a portion of the first passivation layer 103 located both between the contact pad 105 and the underlying uppermost metal layer 102 and also between the outermost contact regions of the contact pad 105 and the underlying uppermost passivation layer 103.

Although the present invention and its advantages have been described in detail, it should be understood that various changes, substitutions and alterations can be made herein without departing from the spirit and scope of the invention as defined by the appended claims. For example, the UBM may be formed into any suitable shape as it extends through the second passivation layer. Further, any suitable methods may be used to form each of the individual layers.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   a contact pad over the substrate;
   a passivation layer over the contact pad; and
   a single and continuous underbump metallization (UBM) over the contact pad and extending through the passivation layer, wherein the UBM has an octagonal shape over the passivation layer, wherein the passivation layer has an octagonal ring shaped opening underlying the UBM through which the UBM extends, an outer edge of the opening being octagon shaped and an inner edge of the opening being octagon shaped, wherein the UBM contacts the contact pad through the opening, wherein a top surface of the UBM is recessed over the opening, and wherein the contact pad extends laterally beyond an edge of a contact formed over the UBM.

2. The semiconductor device of claim 1, wherein the contact pad is a raised contact pad.

3. The semiconductor device of claim 1, wherein the UBM comprises a layer of titanium, a layer of copper, and a layer of nickel.

4. The semiconductor device of claim 1, wherein a distance between the outer edge and the inner edge is about 10 µm.

5. The semiconductor device of claim 1, wherein a distance between the outer edge and the inner edge is about 20 µm.

6. The semiconductor device of claim 5, wherein a percentage of the UBM contacts the contact pad, and the percentage is from about 41% to about 62%.

7. A semiconductor device comprising:
   a conductor disposed over a substrate, a dielectric layer extending along sidewalls of the conductor;
   a second passivation layer over and contacting the dielectric layer;
   a first passivation layer over and contacting the second passivation layer, wherein the first passivation layer, the second passivation layer, and the dielectric layers are separate layers;
   a raised contact pad, comprising:
      a first portion disposed in the first passivation layer, a major surface of the first portion being parallel to a major surface of the first passivation layer;
      a second portion and a third portion respectively extending away from the first portion and through the second passivation layer to contact the conductor, wherein the second portion and the third portion are laterally separated from each other, wherein an upper surface of the second passivation layer contacts a bottom surface of the first passivation layer, wherein a bottom surface of the second passivation layer contacts an upper surface of the conductor;
   an underbump metallization in contact with the raised contact pad, the underbump metallization being conformal and being the sole underbump metallization in contact with the raised contact pad, the underbump metallization further comprising:
      a first portion of the underbump metallization extending away from the raised contact pad through the first passivation layer;
      a second portion of the underbump metallization extending away from the raised contact pad through the first passivation layer, the second portion of the underbump metallization being laterally separated from the first portion of the underbump metallization by at least a part of the first passivation layer;
      a third portion of the underbump metallization extending between the first portion of the underbump metallization and the second portion of the underbump metallization; and
      a fourth portion of the underbump metallization extending away from the raised contact pad through the first passivation layer, wherein the first portion of the underbump metallization and the second portion of the underbump metallization are aligned in a first direction and the third portion of the underbump metallization is offset from the first direction.

8. The semiconductor device of claim 7, wherein the first portion of the underbump metallization and the second portion of the underbump metallization are portions of an octagon.

9. The semiconductor device of claim 8, wherein the octagon has a thickness of about 10 µm.

10. The semiconductor device of claim 7, wherein the underbump metallization comprises three or more layers of conductive material.

11. The semiconductor device of claim 10, wherein the underbump metallization comprises a layer of titanium, a layer of copper, and a layer of nickel.

12. A semiconductor device comprising:
    a substrate;
    a contact pad over the substrate;
    a first passivation layer over the contact pad; and
    a single, continuous, conformal underbump metallization (UBM) over the contact pad and extending through the first passivation layer, wherein the UBM has an octagonal shape over the first passivation layer, wherein the first passivation layer has an octagonal ring shaped opening underlying the UBM through which the UBM extends, an outer edge of the opening being octagon shaped and an inner edge of the opening being octagon shaped, wherein the UBM contacts the contact pad through the opening, and wherein an edge of the contact pad extends beyond an edge of a bump formed over the UBM in a direction that is parallel to a top surface of the substrate.

13. The semiconductor device of claim 12, wherein a shortest distance between the inner edge and the outer edge is about 10 µm.

14. The semiconductor device of claim 12, wherein a shortest distance between the inner edge and the outer edge is about 20 µm.

15. The semiconductor device of claim 12, wherein the UBM has a thickness that is about five times a height of the first passivation layer.

16. The semiconductor device of claim 12, wherein a percentage of the UBM touches the contact pad, and the percentage is from about 41% to about 62%.

17. The semiconductor device of claim 12, wherein the contact pad is a raised contact pad.

18. The semiconductor device of claim 17, wherein the contact pad has a portion extending away from the UBM through a second passivation layer, and wherein the first passivation layer and the second passivation layer are a same material.

19. The semiconductor device of claim 12, wherein the UBM comprises three or more layers of conductive material.

20. The semiconductor device of claim 19, wherein the UBM comprises a layer of titanium, a layer of copper, and a layer of nickel.

* * * * *